United States Patent
Kim et al.

(10) Patent No.: US 10,064,274 B2
(45) Date of Patent: Aug. 28, 2018

(54) CONDUCTIVE ADHESIVE FILM AND METHOD OF ATTACHING ELECTRONIC DEVICE USING THE SAME

(71) Applicant: Samsung Display Co., Ltd., Yongin-si, Gyeonggi-do (KR)

(72) Inventors: Euttum Kim, Cheonan-si (KR); Chulho Jung, Daegu (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/287,591

(22) Filed: Oct. 6, 2016

(65) Prior Publication Data
US 2017/0135209 A1    May 11, 2017

(30) Foreign Application Priority Data
Nov. 5, 2015 (KR) .................... 10-2015-0155331

(51) Int. Cl.
| | |
|---|---|
| *H05K 1/09* | (2006.01) |
| *H05K 1/11* | (2006.01) |
| *H05K 3/32* | (2006.01) |
| *H05K 3/36* | (2006.01) |
| *H05K 1/18* | (2006.01) |

(52) U.S. Cl.
CPC ............ *H05K 1/11* (2013.01); *H05K 1/09* (2013.01); *H05K 3/323* (2013.01); *H05K 1/189* (2013.01); *H05K 3/361* (2013.01); *H05K 2201/10128* (2013.01)

(58) Field of Classification Search
CPC .. H05K 1/09; H05K 1/16; H01L 21/02; H01L 21/56; H01L 21/58; H01L 21/60; H01L 21/70; H01L 23/00; H01L 23/02; H01L 23/48; H01L 23/52; H01R 4/00; H01R 4/04; H01R 4/70; H01R 4/72; C08G 59/00; C08G 59/18
USPC ....... 174/261, 250, 259, 260, 117 A, 117 FF, 174/DIG. 8; 257/686, 690, 734; 428/166, 209, 212, 343; 438/637, 644; 156/52, 219, 272.2, 273.9, 310; 525/191
See application file for complete search history.

(56) References Cited

U.S. PATENT DOCUMENTS

| | | | | |
|---|---|---|---|---|
| 4,588,456 | A * | 5/1986 | Dery ................... | H01R 4/04 156/295 |
| 4,642,421 | A * | 2/1987 | Dery ................... | H01R 4/04 156/52 |
| 4,832,248 | A * | 5/1989 | Soni ................... | H01R 4/723 174/84 R |

(Continued)

FOREIGN PATENT DOCUMENTS

| | | |
|---|---|---|
| JP | 2006-053139 A | 2/2006 |
| KR | 10-2007-0079219 A | 8/2007 |

(Continued)

*Primary Examiner* — Xiaoliang Chen
(74) *Attorney, Agent, or Firm* — Lewis Roca Rothgerber Christie LLP

(57) ABSTRACT

A conductive adhesive film includes a first adhesive member including a first insulating adhesive layer having a first viscosity, a plurality of first conductive balls being in the first insulating adhesive layer, and a second adhesive member including a second insulating adhesive layer having a second viscosity greater than the first viscosity, a plurality of second conductive balls being in the second insulating adhesive layer.

12 Claims, 10 Drawing Sheets

(56) References Cited

U.S. PATENT DOCUMENTS

| | | | | |
|---|---|---|---|---|
| 4,940,179 | A * | 7/1990 | Soni | B29C 61/0616 174/84 R |
| 5,052,610 | A * | 10/1991 | Guerra | H01R 4/723 174/DIG. 8 |
| 6,034,331 | A * | 3/2000 | Tsukagoshi | H01L 24/29 174/250 |
| 6,338,195 | B1 * | 1/2002 | Tsukagoshi | H01L 24/29 257/E21.514 |
| 6,376,050 | B1 * | 4/2002 | Terasaki | H01L 24/83 174/259 |
| 6,528,867 | B1 * | 3/2003 | Ahmad | H01L 23/4951 257/666 |
| 8,796,557 | B2 * | 8/2014 | Ishimatsu | C09J 7/00 174/250 |
| 2002/0173145 | A1 * | 11/2002 | Honda | H01L 21/76843 438/637 |
| 2005/0194680 | A1 * | 9/2005 | Honda | H01L 21/563 257/734 |
| 2006/0231939 | A1 * | 10/2006 | Kawabata | H01L 23/5385 257/686 |
| 2008/0150120 | A1 * | 6/2008 | Nishimura | H01L 21/6836 257/690 |
| 2010/0096175 | A1 * | 4/2010 | Ishimatsu | C09J 7/00 174/260 |
| 2010/0277885 | A1 | 11/2010 | Tatsuzawa et al. | |
| 2012/0145315 | A1 * | 6/2012 | Knaapila | B82Y 30/00 156/273.9 |
| 2012/0168213 | A1 * | 7/2012 | Park | C09J 163/00 174/257 |
| 2012/0240992 | A1 * | 9/2012 | Svasand | H01B 1/24 136/256 |
| 2013/0196129 | A1 * | 8/2013 | Lee | B32B 7/12 428/212 |
| 2015/0243626 | A1 * | 8/2015 | Sato | B32B 7/12 428/166 |

FOREIGN PATENT DOCUMENTS

| | | |
|---|---|---|
| KR | 10-2011-0034057 B1 | 7/2011 |
| KR | 10-2012-0130409 A | 12/2012 |
| KR | 10-2009-0024311 B1 | 12/2013 |

\* cited by examiner

CONDUCTIVE ADHESIVE FILM AND METHOD OF ATTACHING ELECTRONIC DEVICE USING THE SAME

CROSS-REFERENCE TO RELATED APPLICATION

This application claims priority to, and the benefit of, Korean Patent Application No. 10-2015-0155331, filed on Nov. 5, 2015, in the Korean Intellectual Property Office, the content of which is herein incorporated by reference in its entirety.

BACKGROUND

1. Field

Aspects of the present disclosure relate to a conductive adhesive film and a method of attaching electronic devices using the same.

2. Description of the Related Art

In general, an electronic device includes two or more electronic components. For instance, an electronic device, such as a mobile phone, a notebook computer, a television set, etc., includes a display panel, a main wiring substrate, and a flexible wiring substrate.

The two electronic components are electrically connected to each other by coupling pad parts to each other. A process of electrically connecting the pad parts of the two electronic components includes aligning the pad parts of the two electronic components and coupling the pad parts of the two electronic components.

SUMMARY

Aspects of embodiments of the present disclosure are directed to a conductive adhesive film having low contact resistance and low dispersion of the number of valid indentation impressions caused by conductive balls.

Aspects of embodiments of the present disclosure are directed to a method of attaching an electronic device using the conductive adhesive film having the low dispersion of the number of valid indentation impressions caused by conductive balls.

According to some embodiments of the inventive concept there is provided a conductive adhesive film including: a first adhesive member including a first insulating adhesive layer having a first viscosity, a plurality of first conductive balls being in the first insulating adhesive layer; and a second adhesive member including a second insulating adhesive layer having a second viscosity greater than the first viscosity, a plurality of second conductive balls being in the second insulating adhesive layer.

In an embodiment, the first adhesive member is adjacent to the second adhesive member.

In an embodiment, the second insulating adhesive layer has a thickness that is substantially equal to a diameter of each of the second conductive balls.

In an embodiment, the first insulating adhesive layer has a thickness equal to or greater than about 4.5 micrometers and less than or equal to about 5.5 micrometers, and the second insulating adhesive layer has a thickness equal to or greater than about 2.5 micrometers and less than or equal to about 3.5 micrometers.

In an embodiment, each of the first conductive balls and each of the second conductive balls have a diameter equal to or greater than about 2.5 micrometers and less than or equal to about 3.5 micrometers.

In an embodiment, the first viscosity is in a range equal to or greater than about 15,000 Pa·s and less than or equal to about 20,000 Pa·s, and the second viscosity is in a range equal to or greater than about 30,000 Pa·s and less than or equal to about 50,000 Pa·s.

In an embodiment, each of the first and second insulating adhesive layers includes an epoxy resin or an acrylic resin.

In an embodiment, the conductive adhesive film further includes a third adhesive member including a third insulating adhesive layer having a third viscosity less than the first viscosity.

In an embodiment, the third insulating adhesive layer has a thickness equal to or greater than about 11.5 micrometers and less than or equal to about 12.5 micrometers.

In an embodiment, the third viscosity is in a range equal to or greater than about 800 Pa·s and less than or equal to about 1,000 Pa·s.

In an embodiment, the first and second conductive balls include a metal material.

In an embodiment, the metal material includes at least one of nickel (Ni), cobalt (Co), chromium (Cr), and iron (Fe).

In an embodiment, the second conductive balls are spaced from each other at regular intervals.

According to some embodiments of the inventive concept there is provided a method of attaching an electronic device, including: aligning a pad part of a first electronic component, a conductive adhesive film, and a pad part of a second electronic component in sequence; attaching the pad part of the first electronic component, the conductive adhesive film, and the pad part of the second electronic component to each other by applying pressure; applying heat to the conductive adhesive film to harden the conductive adhesive film, the conductive adhesive film including: a first adhesive member including a first insulating adhesive layer having a first viscosity, a plurality of first conductive balls being in the first insulating adhesive layer; and a second adhesive member including a second insulating adhesive layer having a second viscosity greater than the first viscosity, a plurality of second conductive balls being in the second insulating adhesive layer.

In an embodiment, the first insulating adhesive layer has a thickness equal to or greater than about 4.5 micrometers and less than or equal to about 5.5 micrometers, the second insulating adhesive layer has a thickness equal to or greater than about 2.5 micrometers and less than or equal to about 3.5 micrometers, and each of the first conductive balls and each of the second conductive balls has a diameter equal to or greater than about 2.5 micrometers and less than or equal to about 3.5 micrometers.

In an embodiment, the first viscosity is in a range equal to or greater than about 15,000 Pa·s and less than or equal to about 20,000 Pa·s, and the second viscosity is in a range equal to or greater than about 30,000 Pa·s and less than or equal to about 50,000 Pa·s.

In an embodiment, each of the first and second insulating adhesive layers includes an epoxy resin or an acrylic resin.

In an embodiment, the second conductive balls are spaced from each other at regular intervals.

In an embodiment, the first electronic component includes a display panel configured to display an image, and the second electronic component includes a connection wiring substrate including a flexible wiring substrate and a data driving circuit.

In an embodiment, the first electronic component is a main circuit board configured to apply image data, a control signal, or a power supply voltage to a display panel, and the second electronic component includes a connection wiring substrate including a flexible wiring substrate and a data driving circuit.

According to the above, the contact resistance of the conductive adhesive film may be reduced and the dispersion of the number of the valid indentation impression may be reduced.

In addition, during the attachment of the electronic device, the contact resistance caused by the conductive adhesive film may be reduced and the dispersion of the number of the valid indentation impression, caused by the conductive balls, may be reduced.

BRIEF DESCRIPTION OF THE FIGURES

The above and other aspects of the present disclosure will become readily apparent by reference to the following detailed description when considered in conjunction with the accompanying drawings wherein.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various suitable changes and modifications of the various embodiments described herein can be made without departing from the scope and spirit of the present disclosure.

Hereinafter, the present invention will be explained in detail with reference to the accompanying drawings.

Figure 1:
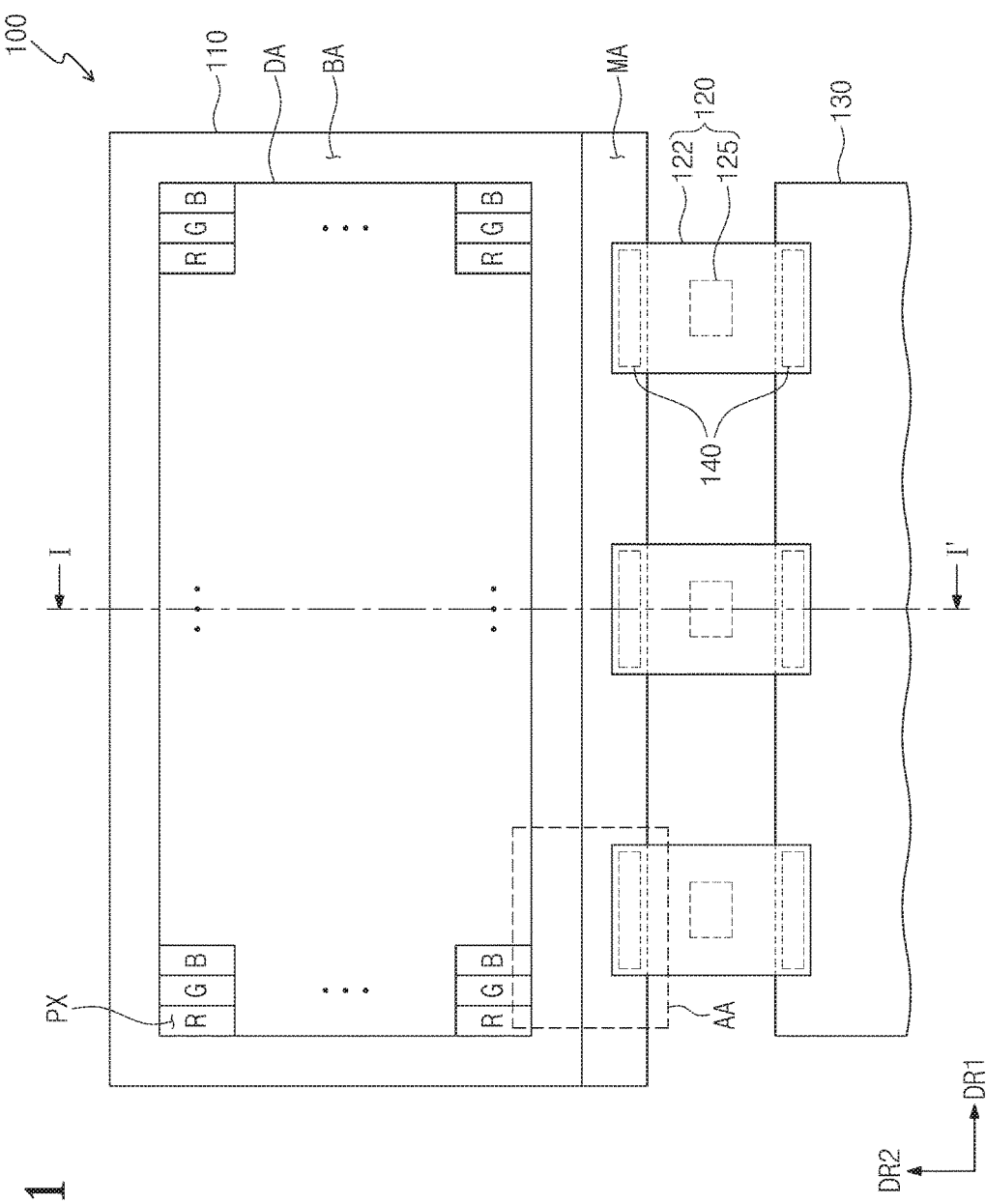
FIG. 1 is a plan view showing an electronic device according to an exemplary embodiment of the present disclosure.
Figure 2:
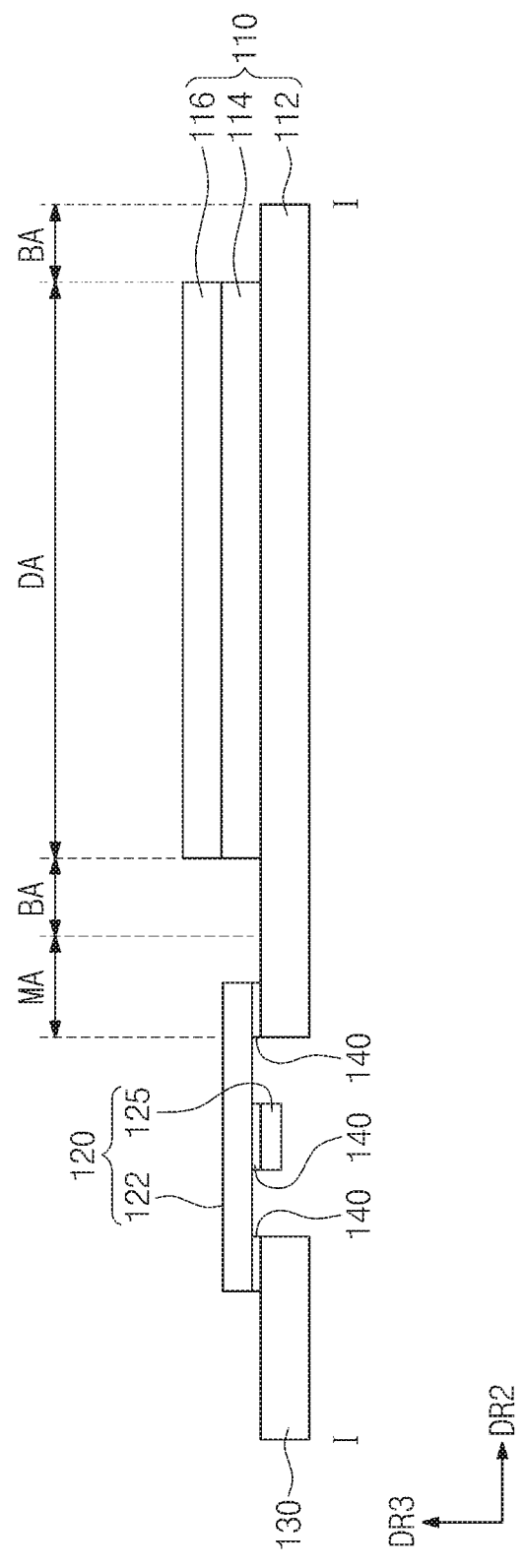
FIG. 2 is a cross-sectional view taken along the line I-I' of FIG. 1.
Figure 3A:
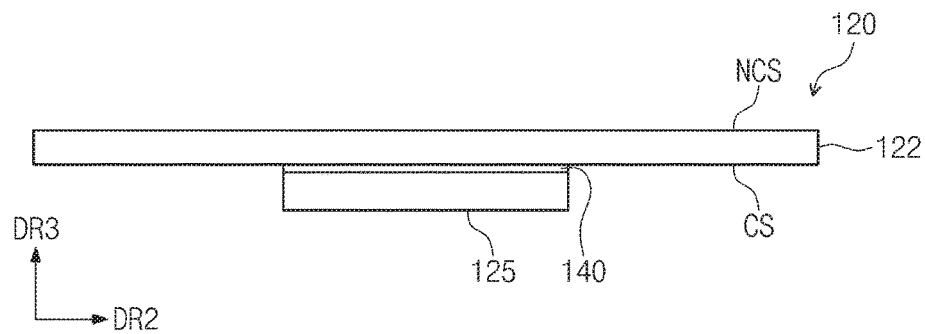
FIG. 3A is a side view showing a second electronic component according to an exemplary embodiment of the present disclosure.
Figure 3B:
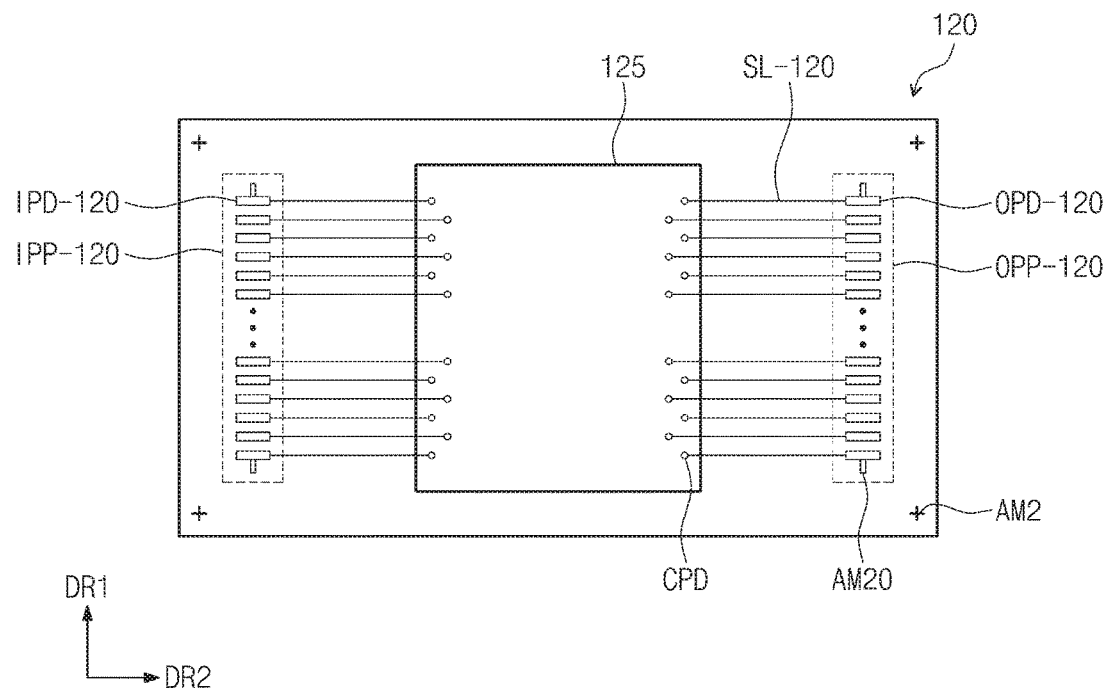
FIG. 3B is a plan view showing a second electronic component according to an exemplary embodiment of the present disclosure.

FIG. 1 is a plan view showing an electronic device 100 according to an exemplary embodiment of the present disclosure; FIG. 2 is a cross-sectional view taken along the line I-I' of FIG. 1; FIG. 3A is a side view showing a second electronic component 120 according to an exemplary embodiment of the present disclosure; and FIG. 3B is a plan view showing the second electronic component 120 according to an exemplary embodiment of the present disclosure.

Referring to FIGS. 1 and 2, the electronic device 100 includes first, second, and third electronic components 110, 120, and 130. The first, second, and third electronic components (e.g., the first, second, and third electronic devices) 110, 120, and 130 are electrically connected to each other. In the present exemplary embodiment, the first electronic component 110 may be, but is not limited to, an electric optical panel, the second electronic component 120 may be, but is not limited to, a connection wiring substrate, and the third electronic component 130 may be, but is not limited to, a main circuit board. In the present exemplary embodiment, the electronic device 100 includes three second electronic components 120, but the number of the second electronic components 120 should not be limited to three. That is, the electronic device 100 may include only one or two second electronic component 120 depending on the use or size thereof.

As shown in FIG. 1, the electric optical panel 110 (hereinafter, referred to as a display panel) may be a display panel that applies a driving signal to a plurality of pixels PX to display a desired image. The pixels PX are arranged in a matrix form along a first direction DR1 and a second direction DR2 substantially perpendicular to the first direction DR1. In the present exemplary embodiment, the pixels PX include first, second, and third pixels respectively displaying red, green, and blue colors R, G, and B. In addition, the pixels PX may further include a portion of pixels respectively displaying white, cyan, and magenta colors. The pixels PX may be defined as a display part of the display panel 110.

The display panel 110 may be, but is not limited to, a liquid crystal display panel, an organic light emitting display panel, an electrowetting display panel, or the like. In the present exemplary embodiment, the display panel 110 will be described as an organic light emitting display panel.

When viewed in a plan view, the display panel 110 includes a display area DA in which the pixels PX are arranged, a non-display area BA surrounding the display area DA, and a mounting area MA to which the second electronic component 120 is coupled. In the present exemplary embodiment, the non-display area BA and the mounting area MA may not be distinct from each other. That is, the non-display area BA may be omitted or the mounting area MA may be a portion of the non-display area BA.

Referring to FIG. 2, the display panel 110 includes a display substrate 112, a display element layer 114 disposed on the display substrate 112, and a sealing layer 116 disposed on the display element layer 114. The display substrate 112 includes a base substrate, an insulating layer disposed on the base substrate, a functional layer, and a conductive layer. The conductive layer includes gate lines, data lines, and other signal lines. In addition, the conductive layer includes a pad part connected to the lines. The lines apply the driving signal to the pixels PX.

The display element layer 114 includes a plurality of insulating layers forming the pixels PX, a functional layer, and a conductive layer. The functional layer includes an organic light emitting layer. The sealing layer 116 is disposed on the display element layer 114. The sealing layer 116 protects the display element layer 114. The sealing layer 116 may cover a side surface of the display element layer 114. In addition, the sealing layer 116 may be omitted or replaced with another display substrate according to the kind of the display panel 110.

A black matrix may be disposed in the non-display area BA to block light. A gate driving circuit may be disposed in the non-display area BA to apply a gate signal to the pixels PX. In the present exemplary embodiment, a data driving circuit may be further disposed in the non-display area BA. The pad part may be disposed in the mounting area MA to receive a signal provided from the second electronic component 120.

Referring to FIGS. 1 and 2, the second electronic components 120 includes a flexible wiring substrate 122 and a data driving circuit 125. The data driving circuit 125 includes at least one driving chip. The data driving circuit 125 is electrically connected to wires of the flexible wiring substrate 122. The data driving circuit 125 and the flexible wiring substrate 122 are electrically connected to each other by a conductive adhesive film 140.

In the case where the second electronic component 120 includes the data driving circuit 125, the pad part of the display panel 110 includes data pads electrically connected to data lines and control signal pads electrically connected to control signal lines. The data lines are connected to the pixels PX and the control signal lines are connected to the gate driving circuit. In the present exemplary embodiment, the second electronic component 120 is configured to have a chip-on-film (COF) type package, but it should not be limited thereto or thereby.

Hereinafter, the second electronic component 120 will be described in detail with reference to FIGS. 3A and 3B. The flexible wiring substrate 122 includes an insulating layer, a plurality of pads CPD, IPD-120, and OPD-120, and a plurality of lines SL-120. The pads CPD, IPD-120, and OPD-120 and the lines SL-120 are disposed on the insulating layer. The insulating layer includes polyimide and/or the like.

The pads CPD, IPD-120, and OPD-120 include contact pads CPD making contact with contact terminals of the data driving circuit 125, input pads IPD-120 making contact with the third electronic component 130, and output pads OPD-120 making contact with the display panel 110. The input pads IPD-120 are collectively referred to as an input pad part IPP-120 disposed at one side portion of the flexible wiring substrate 122, and the output pads OPD-120 are collectively referred to as an output pad part OPP-120 disposed at the other side portion of the flexible wiring substrate 122. In the present exemplary embodiment, the contact pads CPD are arranged at both sides of the data driving circuit 125, but the contact pads CPD may be randomly arranged to correspond to the contact pads of the data driving circuit 125 different from the arrangement of the contact pads CPD.

In the present exemplary embodiment, each of the input pad part IPP-120 and the output pad part OPP-120 includes one pad row. The pad row includes a plurality of pads arranged in the first direction DR1. Each of the input pad part IPP-120 and the output pad part OPP-120 may include a plurality of pad rows.

A portion of the lines SL-120 connects the contact pads CPD and the input pads IPD-120 and the other portion of the lines SL-120 connects the contact pads CPD and the output pads OPD-120. The lines SL-120 may directly connect a portion of the input pads IPD-120 and a portion of the output pads OPD-120.

The flexible wiring substrate 122 may further include a solder resist layer disposed on the insulating layer to cover at least two lines SL-120. The solder resist layer may further cover a surrounding of the pads CPD, IPD-120, and OPD-120 and expose at least the pads CPD, IPD-120, and OPD-120. To this end, openings are formed through the solder resist layer to respectively correspond to the pads CPD, IPD-120, and OPD-120.

In addition, the flexible wiring substrate 122 includes alignment marks AM2 and AM20 required for a bonding process described later. FIG. 3B shows four first alignment marks AM2 spaced apart from the pads CPD, IPD-120, and OPD-120, and shows four second alignment marks AM20 connected to the input pads IPD-120 and the output pads OPD-120. One of the first and second alignment marks AM2 and AM20 may be omitted.

In the present exemplary embodiment, a surface on which the input pads IPD-120 and the output pads OPD-120 are exposed is referred to as a coupling surface CS and a surface opposite to the coupling surface CS is referred to as a non-coupling surface NCS. In the present exemplary embodiment, the data driving circuit 125 is disposed on the coupling surface CS, but it should not be limited thereto or thereby. That is, the data driving circuit 125 may be disposed on the non-coupling surface NCS.

Referring to FIGS. 1 and 2, the third electronic component 130 applies image data, control signals, and power supply voltages to the display panel 110 and/or the data driving circuit 125. The third electronic component 130 serves as a wiring substrate different from the flexible wiring substrate 122 and includes an active device and a passive device. The third electronic component 130 is a flexible wiring substrate or a rigid wiring substrate, and includes a pad part connected to the flexible wiring substrate 122.

Referring to FIGS. 1 to 3B, the output pad part OPP-120 of the flexible wiring substrate 122 is electrically connected to the pad part of the display panel 110 by the conductive adhesive film 140. The input pad part IPP-120 of the flexible wiring substrate 122 is electrically connected to the pad part of the third electronic component 130 by the conductive adhesive film 140. The conductive adhesive film 140 may be, but is not limited to, an anisotropic conductive film (ACF). In the present exemplary embodiment, the conductive adhesive film 140 may be replaced with a solder bump.

The pad part of the display panel 110 includes pads corresponding to the output pads OPD-120 of the flexible wiring substrate 122. In addition, the pad part of the third electronic component 130 includes pads corresponding to the input pads IPP-120 of the flexible wiring substrate 122.

Hereinafter, an electrical connection structure between the first, second, and third electronic components 110, 120, and 130 will be described in detail with reference to the pad part of the display panel 110 and the output pad part OPP-120 of the flexible wiring substrate 122. The electrical connection structure between the second and third electronic components 120 and 130 may correspond to the electrical connection structure between the pad part of the display panel 110 and the output pad OPP-120 of the flexible wiring substrate 122. In addition, the electronic device 100 according to the present exemplary embodiment is configured to include the first, second, and third electronic components 110, 120, and 130; however, one of the first and third electronic components 110 and 130 may be omitted.

Figure 4A:
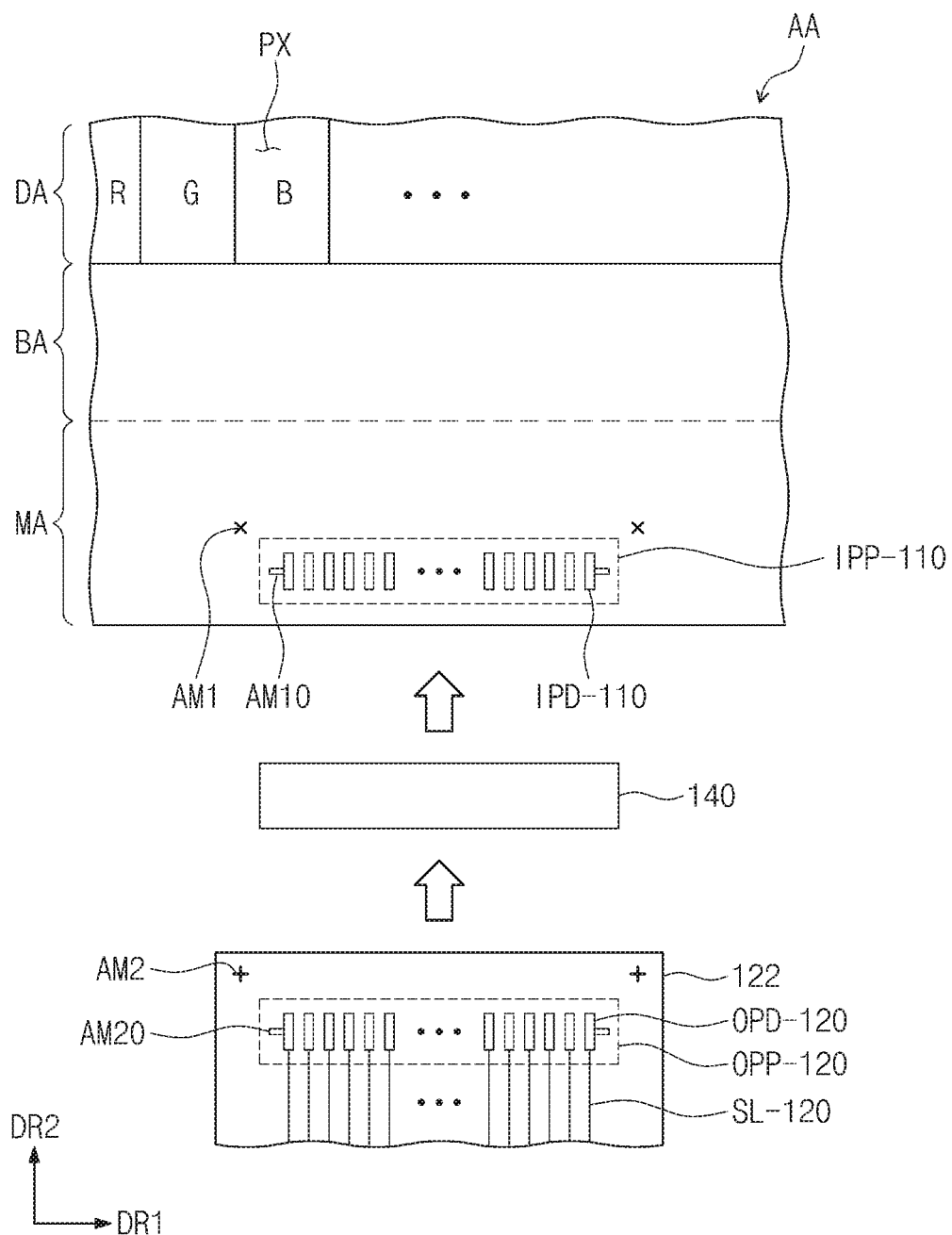
FIG. 4A is a plan view showing pad parts of two electronic components shown in FIG. 1 separated from each other.
Figure 4B:
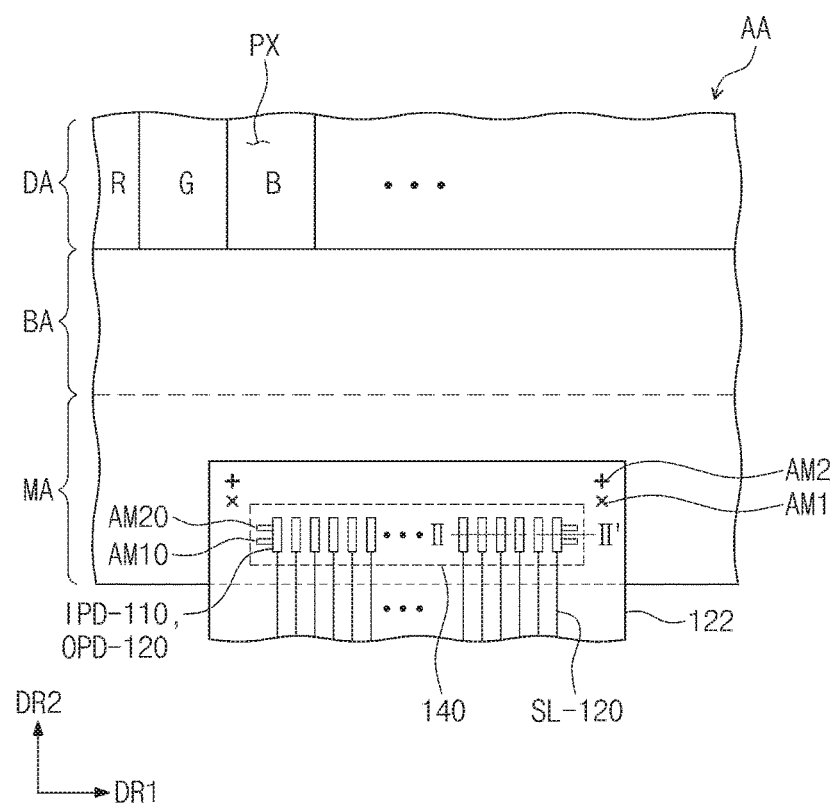
FIG. 4B is a plan view showing pad parts of two electronic components shown in FIG. 1 coupled to each other.
Figure 4C:
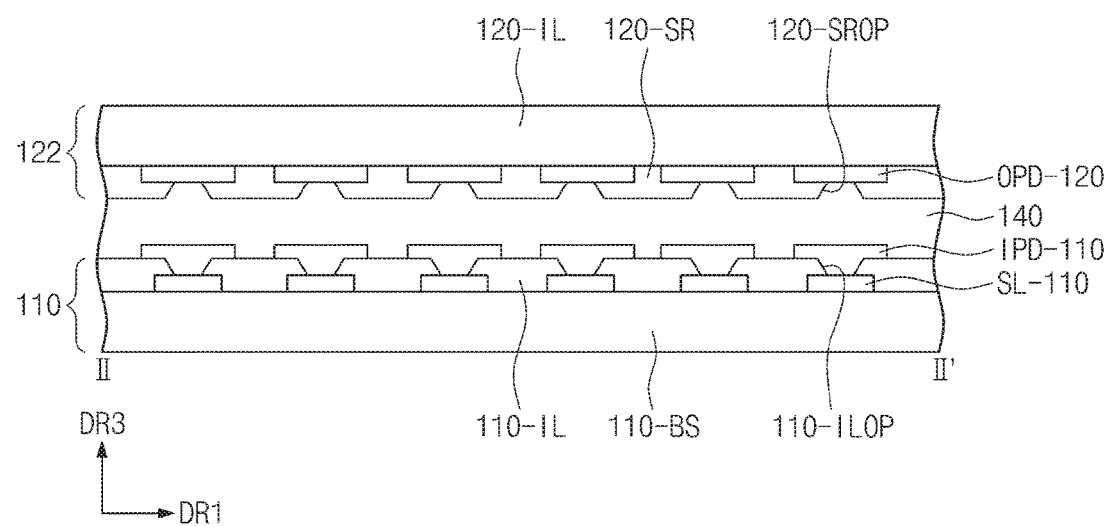
FIG. 4C is a cross-sectional view taken along the line II-II" shown in FIG. 4B.

FIG. 4A is a plan view showing the pad parts of the two electronic components shown in FIG. 1 separated from each other; FIG. 4B is a plan view showing the pad parts of the two electronic components shown in FIG. 1 coupled to each other; and FIG. 4C is a cross-sectional view taken along the line II-II" shown in FIG. 4B, Referring to FIG. 4A, the display panel 110 includes an input pad part IPP-110 corresponding to the output pad part OPP-120 of the flexible wiring substrate 122. The input pad part IPP-110 includes input pads IPD-110 corresponding to the output pads OPD-120 of the flexible wiring substrate 122. In the present exemplary embodiment, the input pads IPD-110 correspond to the output pads OPD-120 in a one-to-one correspondence; however, they should not be limited thereto or thereby. That is, according to another embodiment, the number of pads and pad rows included in the input pad part IPP-110 may be different from the number of pads and pad rows included in the output pad part OPP-120.

The display panel 110 includes first and second alignment marks AM1 and AM10 respectively corresponding to the first and second alignment marks AM2 and AM20 of the flexible wiring substrate 122. One of the first and second alignment marks AM1 and AM10 may be omitted.

Referring to FIG. 4B, the output pads OPD-120 of the flexible wiring substrate 122 are electrically connected to the input pads IPD-110 of the display panel 110. The output pad part OPP-120 and the input pad part IPP-110 are aligned using the first and second alignment marks AM2 and AM20 of the flexible wiring substrate 122 and the first and second alignment marks AM1 and AM10 of the display panel 110, and an alignment correction is performed along the second direction DR2. Then, the output pads OPD-120 are coupled to the input pads IPD-110 such that the conductive adhesive film 140 is disposed between the output pads OPD-120 and the input pads IPD-110 using a suitable tool.

Referring to FIG. 4C, signal lines SL-110 are disposed on the base substrate 110-BS of the display panel 110. An insulating layer 100-IL is disposed on the base substrate 110-BS. The insulating layer 110-IL includes a barrier layer and passivation layers. The input pads IPD-110 are disposed on the insulating layer 110-IL and connected to the signal lines SL-110 through thru-holes (e.g., openings) 110-ILOP formed through the insulating layer 110-IL.

The lines SL-120 (e.g., refer to FIG. 4B) and the output pads OPD-120 connected to the lines SL-120 are disposed on the insulating layer 120-IL of the flexible wiring substrate 122. The lines SL-120 and the output pads OPD-120 are disposed on the same layer. In the present exemplary embodiment, the lines SL-120 and the output pads OPD-120 may be disposed on different layers from each other such that another insulating layer is disposed between the lines SL-120 and the output pads OPD-120. In this case, the lines SL-120 are connected to the output pads OPD-120 through thru-holes (e.g., openings) formed through another insulating layer.

The solder resist layer 120-SR is disposed on the insulating layer 120-IL. The output pads OPD-120 are exposed to the outside through thru-holes (e.g., openings) 120-SROP formed through the solder resist layer 120-SR. In the present exemplary embodiment, the solder resist layer 120-SR covers only the lines SL-120 and does not cover the output pads OPD-120.

The output pads OPD-120 are electrically connected to the input pads IPD-110 through the conductive adhesive film 140. Each of the output pads OPD-120 is electrically connected to a corresponding input pad of the input pads IPD-110 through a plurality of conductive balls included in the conductive adhesive film 140.

Figure 5A:
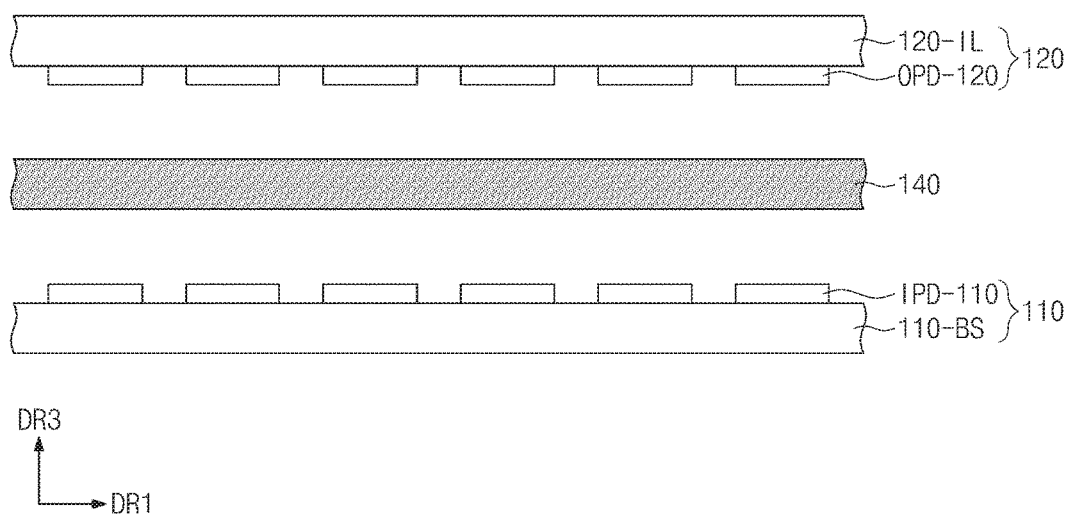
FIGS. 5A-5C are cross-sectional views showing a method of attaching two electronic components according to an exemplary embodiment of the present disclosure.
Figure 5B:
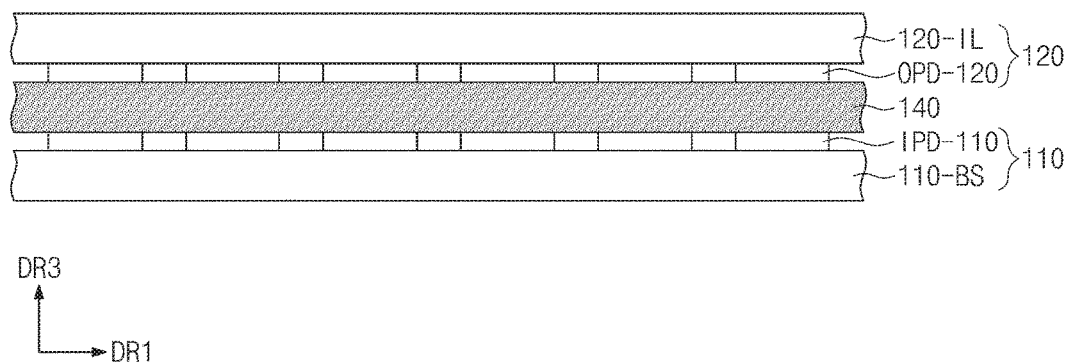
Figure 5C:
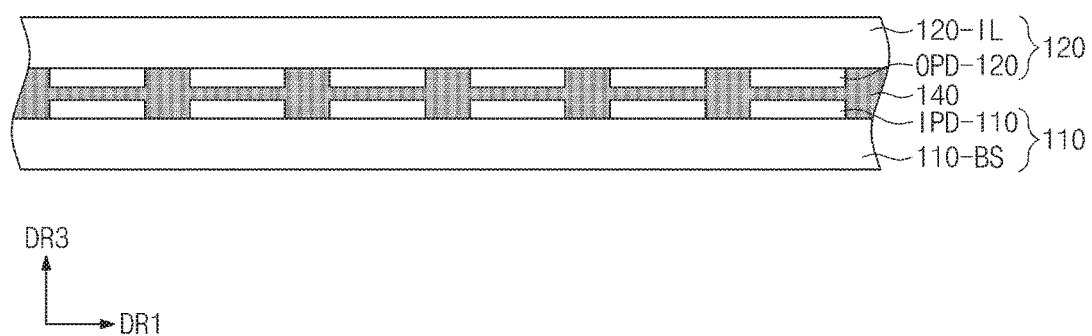
Figure 6:
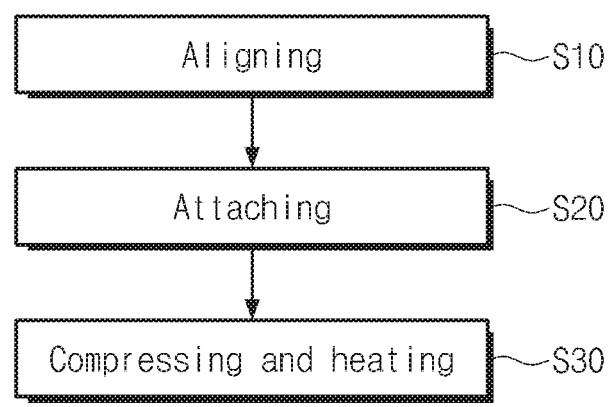
FIG. 6 is a flow diagram showing a method of attaching electronic devices according to an exemplary embodiment of the present disclosure.

FIGS. 5A, 5B, and 5C are cross-sectional views showing a method of attaching the two electronic components 110 and 120 according to an exemplary embodiment of the present disclosure; and FIG. 6 is a flow diagram showing a method of attaching the electronic device 100 according to an exemplary embodiment of the present disclosure.

For the convenience of explanation, FIGS. 5A to 5C show only the base substrate 110-BS and the input pads IPD-110 of the first electronic component 110, and the insulating layer 120-IL and the output pads OPD-120 of the second electronic component 120. The base substrate 110-BS and the input pads IPD-110 shown in FIGS. 5A to 5C correspond to the input pad part IPP-110 shown in FIG. 4A. In addition, the insulating layer 120-IL and the output pads OPD-120 shown in FIGS. 5A to 5C correspond to the output pad part OPP-120 shown in FIG. 4A.

In FIGS. 5A and 6, the first electronic component 110, the conductive adhesive film 140, and the second electronic component 120 are sequentially arranged (S10). Each of the input pads IPD-110 is disposed to overlap with a corresponding output pad of the output pads OPD-120 in a third direction DR3.

In FIGS. 5B and 6, the first electronic component 110, the conductive adhesive film 140, and the second electronic component 120 are attached to each other by applying a pressure to the first electronic component 110, the conductive adhesive film 140, and the second electronic component 120 (S20). In the present exemplary embodiment, the conductive adhesive film 140 may be firstly attached to the input pads IPD-110. However, the conductive adhesive film 140 may be firstly attached to the output pads OPD-120 according to another embodiment. In addition, the conductive adhesive film 140 may be substantially simultaneously or concurrently attached to the input pads IPD-110 and the output pads OPD-120.

In FIGS. 5C and 6, the first and second electronic components 110 and 120 are compressed to each other (i.e., pressed against each other) and heated (S30). When a pressure is applied to the first and second electronic components 110 and 120 in the third direction DR3 such that the first and second electronic components 110 and 120 are closer to each other, the conductive adhesive film 140 having a viscosity is deformed by the pressure. That is, the shape of the conductive adhesive film 140 is deformed to correspond to the shape of each of the first and second electronic components 110 and 120.

In the case where the first and second electronic components 110 and 120 are attached to each other by the conductive adhesive film 140, each of the input pads IPD-110 is electrically connected to the corresponding output pad of the output pads OPD-120 by the conductive balls distributed in the conductive adhesive film 140.

The input pads IPD-110 are insulated from each other by an insulating adhesive layer included in the conductive adhesive film 140. The output pads OPD-120 are insulated from each other by the insulating adhesive layer included in the conductive adhesive film 140. Each of the input pads IPD-110 is insulated from the output pads OPD-120, which are not overlapped with the input pads IPD-110 in the third direction DR3, by the insulating adhesive layer included in the conductive adhesive film 140.

When the conductive adhesive film 140 is heated, the conductive adhesive film 140 having viscosity is hardened. That is, the conductive adhesive film 140 is hardened by the heat. When the conductive adhesive film 140 is hardened, the first and second electronic components 110 and 120 are completely attached to each other.

FIGS. 7A, 7B, 7C, and 7D are cross-sectional views showing conductive adhesive films 140, 140-1, 140-2, and 140-3 according to an exemplary embodiment of the present disclosure. The conductive adhesive films 140, 140-1, 140-2, and 140-3 shown in FIGS. 7A to 7D are before hardening as those shown in FIGS. 5A and 5B.

Figure 7A:
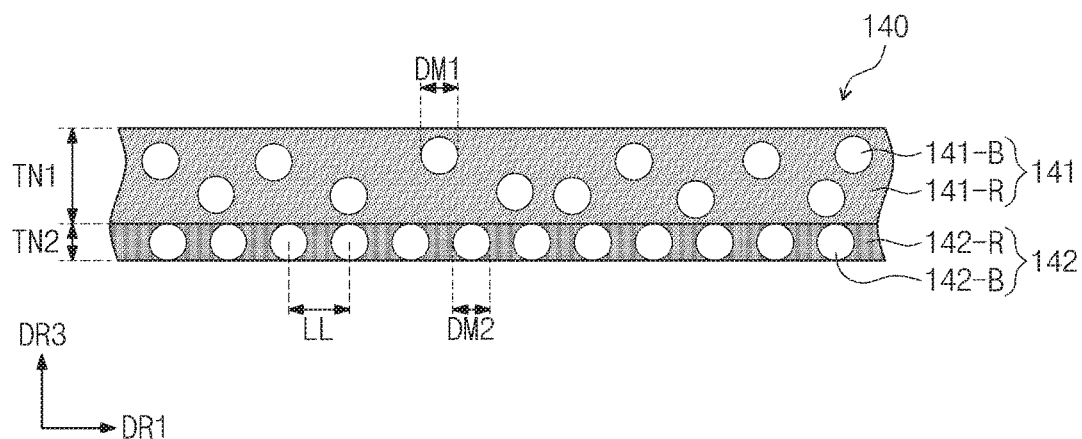
FIGS. 7A-7D are cross-sectional views showing conductive adhesive films according to exemplary embodiments of the present disclosure.

Referring to FIG. 7A, the conductive adhesive film 140 according to the present exemplary embodiment includes a first adhesive member 141 and a second adhesive member 142. The second adhesive member 142 is disposed adjacent to a lower portion of the first adhesive member 151 in the third direction DR3.

The first adhesive member 141 includes a first insulating adhesive layer 141-R having a first viscosity and a plurality of first conductive balls 141-B distributed in the first insulating adhesive layer 141-R. The second adhesive member 142 includes a second insulating adhesive layer 143-R having a second viscosity and a plurality of second conductive balls 142-B distributed in the second insulating adhesive layer 142-R. The second viscosity is greater than the first viscosity. The first viscosity is in a range from about 15,000 Pa·s to about 20,000 Pa·s. The second viscosity is in a range from about 30,000 Pa·s to about 50,000 Pa·s. Here, 1 Pa·s is equal to 1 Ns/m².

Each of the first and second insulating adhesive layers 141-R and 142-R includes an insulating polymer, e.g., an epoxy resin, an acrylic resin, and/or the like. The epoxy resin has a chemical structure in which bisphenol A is repeated. In addition, the epoxy resin is a phenoxy polymer having an epoxy functional group at a terminal end thereof. The acrylic resin is a urethane acrylate or methacrylate polymer has a urethane connection structure (—NHCO—O—) and an acrylate or methacrylate functional group at a terminal end thereof.

According to the present exemplary embodiment, a difference between the first viscosity and the second viscosity may be controlled by adjusting a molecular weight of the insulating polymer included in the first and second insulating adhesive layer 141-R and 142-R. For instance, when the molecular weight of the insulating polymer included in the second insulating adhesive layer 142-R is greater than the molecular weight of the insulating polymer included in the first insulating adhesive layer 141-R, the second viscosity may be greater than the first viscosity.

In addition, each of the first and second insulating adhesive layers 141-R and 142-R may further include additives, such as a filler, a softner, an accelerant, a colerant, a flame retardant, a photostabilizer, a cross-linking agent, a polymerization inhibitor, a curing agent, and/or the like, if desired.

The first and second conductive balls 141-B and 142-B may be conductive fine particles. The conductive fine particles may be conductive particles including a metal material or a metal oxide material, or particles each including an insulating material as its core and a metal or metal oxide material coated on the core. As the metal material, nickel (Ni), iron (Fe), copper (Cu), aluminum (Al), tin (Sn), zinc (Zn), chromium (Cr), cobalt (Co), silver (Ag), gold (Au), and/or the like may be used.

The first insulating adhesive layer 141-R has a thickness TN1 (hereinafter, referred to as a first thickness) of about 4.5 micrometers to about 5.5 micrometers. The second insulating adhesive layer 142-R has a thickness TN2 (hereinafter, referred to as a second thickness) of about 2.5 micrometers to about 3.5 micrometers. Each of the first conductive balls 141-B has a diameter DM1 of about 2.5 micrometers to about 3.5 micrometers and each of the second conductive balls 142-B has a diameter DM2 of about 2.5 micrometers to about 3.5 micrometers.

Because the first thickness TN1 is greater than the diameter DM1 of each of the first conductive balls 141-B, the first conductive balls 141-B are irregularly distributed (e.g., non-uniformly distributed) in the first insulating adhesive layer 141-R. In addition, because the viscosity of the first insulating adhesive layer 141-R is relatively low, the first conductive balls 141-B are relatively free to move in the first insulating adhesive layer 141-R.

The first insulating adhesive layer 141-R has low viscosity, and thus the first insulating adhesive layer 141-R is easily spread by the pressure. Accordingly, a complete contact surface is formed when the first electronic component 110 is attached to the second electronic component 120, so that the contact resistance may be reduced.

Because the first thickness TN1 is greater than the diameter DM1 of each of the first conductive balls 141-B, the first and second electronic components 110 and 120 are more securely attached to each other by the viscosity of the first insulating adhesive layer 141-R.

The second thickness TN2 is substantially equal to the diameter DM2 of each of the second conductive balls 142-B. Therefore, the second conductive balls 142-B are regularly distributed (e.g., uniformly distributed) in the second insulating adhesive layer 142-R. The second conductive balls 142-B are spaced apart from each other at different intervals in the third direction DR3. Because the viscosity of the second insulating adhesive layer 142-R is relatively high, the second conductive balls 142-B may be held in the second insulating adhesive layer 142-R without moving.

Because the second conductive balls 142-B are held in the second insulating adhesive layer 142-R, the second conductive balls 142-B do not move while the first electronic component 110 is attached to the second electronic component 120 as shown in FIGS. 5A to 5C, and thus the dispersion of the number of valid indentation impressions may be lowered. The term "valid indentation impression" used herein refers to marks appearing on the input pads IPD-110 (e.g., refer to FIG. 5A) and the output pads OPD-120 (e.g., refer to FIG. 5A) by the conductive balls 141-B and 142-B while the first and second electronic components 110 and 120 are attached to each other.

However, different from the present exemplary embodiment of the present disclosure, if the first and second insulating adhesive layers 141-R and 142-R have the same or substantially the same viscosity, the following problems may occur. If the first and second insulating adhesive layers 141-R and 142-R have low viscosity, the dispersion of the number of valid indentation impressions becomes high because the second conductive balls 142-B are not securely held. On the contrary, if the first and second insulating adhesive layers 141-R and 142-R have the high viscosity, the first and second insulating adhesive layers 141-R and 142-R are not sufficiently spread to the side of the input pads IPD-110 and the output pads OPD-120, and as a result, the adhesive performance of the first and second insulating adhesive layers 141-R and 142-R is degraded. In addition, if the first and second insulating adhesive layers 141-R and 142-R have the high viscosity, the contact resistance becomes high.

Figure 7B:
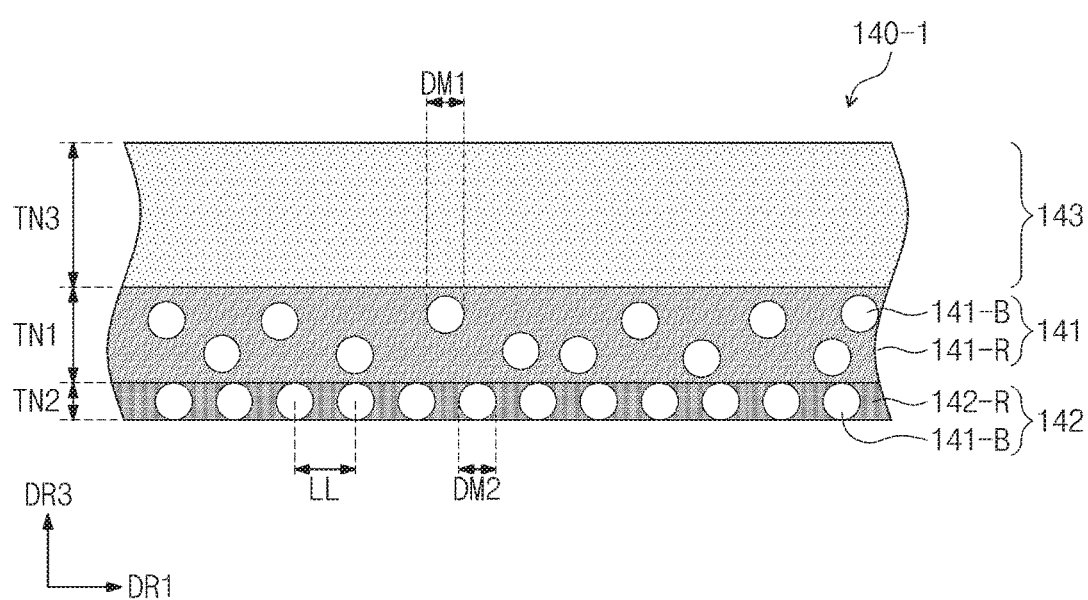

As shown in FIG. 7B, the conductive adhesive film 140-1 according to the present exemplary embodiment includes a first adhesive member 141, a second adhesive member 142, and a third adhesive member 143.

The first and second adhesive members 141 and 142 have the same or substantially the same functions as those described with reference to FIG. 7A, and thus details thereof may not be repeated to avoid redundancy.

The third adhesive member 143 is disposed adjacent to an upper portion of the first adhesive member 141 in the third direction DR3. The third adhesive member 143 includes a third insulating adhesive layer 143-R having the third viscosity. The third viscosity is less than the first viscosity and is in a range of about 800 Pa·s to about 1,000 Pa·s.

Different from the first and second adhesive members 141 and 142, the third adhesive member 143 may not include the conductive balls 141-B and 142-B.

Similar to the first and second insulating adhesive layers 141-R and 142-R, the third insulating adhesive layer 143-R may include an insulating polymer as described with reference to FIG. 5, and thus detailed descriptions of the insulating polymer may not be repeated.

The third insulating adhesive layer 143-R has a thickness TN3 (hereinafter, referred to as a third thickness) of about 11.5 micrometers to about 12.5 micrometers. Accordingly, the third thickness TN3 is greater than the first thickness TN1 or the second thickness TN2.

Referring to FIGS. 5A to 5C, the third insulating adhesive layer 143-R allows the thickness of the conductive adhesive film 140-1 to be thick, and thus an area of the insulating layer 120-IL, in which the output pads OPD-120 are not disposed, and an area of the base substrate 110-BS, in which the input pads IPD-110 are not disposed, may be easily attached to each other by the conductive adhesive film 140-1.

Figure 7C:
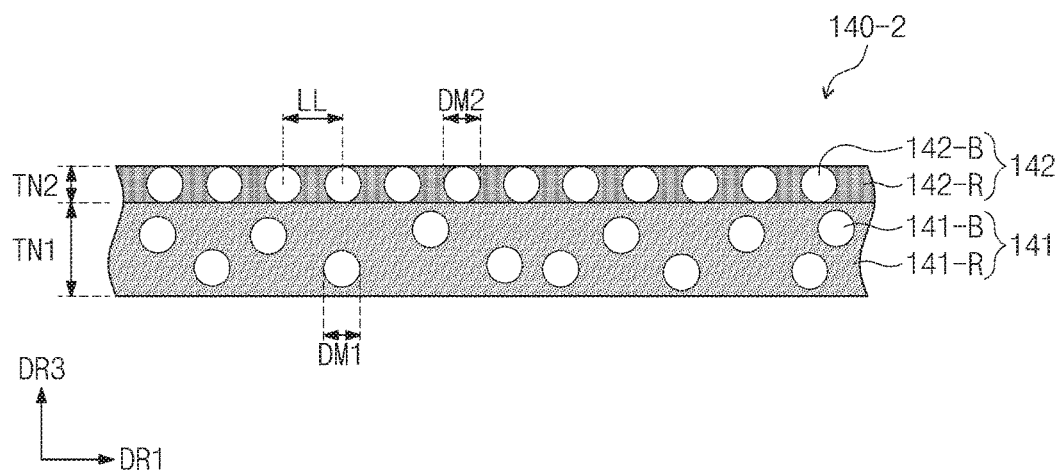

As shown in FIG. 7C, the conductive adhesive film 140-2 according to the present exemplary embodiment includes a first adhesive member 141 and a second adhesive member 142.

Different from the conductive adhesive film 140 shown in FIG. 7A, the second adhesive member 142 is disposed adjacent to an upper portion of the first adhesive member 141 in the third direction DR3.

The first and second adhesive members 141 and 142 shown in FIG. 7C are substantially the same as those described with reference to FIG. 7A except for a vertical arrangement relationship of the first and second adhesive members 141 and 142.

Figure 7D:
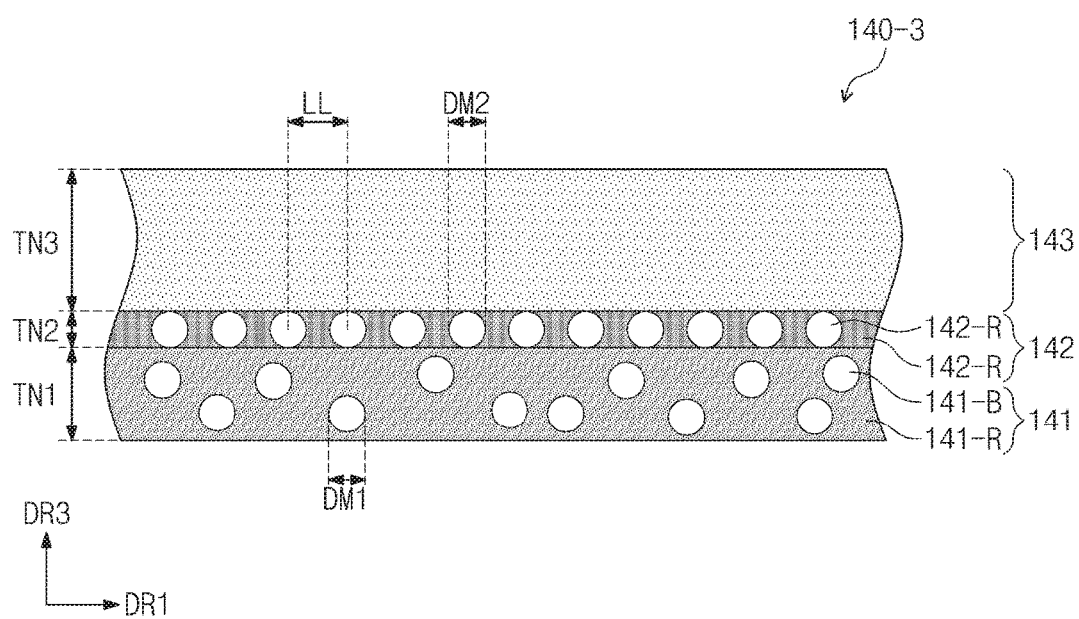

As shown in FIG. 7D, the conductive adhesive film 140-3 according to the present exemplary embodiment includes a first adhesive member 141, a second adhesive member 142, and a third adhesive member 143.

Different from the conductive adhesive film 140-1 shown in FIG. 7B, the third adhesive member 143 is disposed adjacent to an upper portion of the second adhesive member 142 in the third direction DR3.

The first, second, and third adhesive members 141, 142, and 143 shown in FIG. 7D are substantially the same as those described with reference to FIGS. 5A and 5B except for a vertical arrangement relationship of the first, second, and third adhesive members 141, 142, and 143.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "lower", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, and 35 U.S.C. § 132(a). Although the exemplary embodiments of the present invention have been described, it is understood that the present invention should not be limited to these exemplary embodiments but various suitable changes and modifications can be made by one of ordinary skill in the art within the spirit and scope of the present invention as defined by the following claims and equivalents thereof.

What is claimed is:

1. A conductive adhesive film comprising:
a first adhesive member comprising a first insulating adhesive layer having a first viscosity, a plurality of first conductive balls being in the first insulating adhesive layer; and
a second adhesive member comprising a second insulating adhesive layer having a second viscosity greater than the first viscosity, a plurality of second conductive balls being in the second insulating adhesive layer,
wherein the first viscosity is in a range equal to or greater than about 15,000 Pa·s and less than or equal to about 20,000 Pa·s, and the second viscosity is in a range equal to or greater than about 30,000 Pa·s and less than or equal to about 50,000 Pa·s.

2. The conductive adhesive film of claim 1, wherein the first adhesive member is adjacent to the second adhesive member.

3. The conductive adhesive film of claim 2, wherein the second insulating adhesive layer has a thickness that is substantially equal to a diameter of each of the second conductive balls.

4. The conductive adhesive film of claim 1, wherein the first insulating adhesive layer has a thickness equal to or greater than about 4.5 micrometers and less than or equal to about 5.5 micrometers, and the second insulating adhesive layer has a thickness equal to or greater than about 2.5 micrometers and less than or equal to about 3.5 micrometers.

5. The conductive adhesive film of claim 4, wherein each of the first conductive balls and each of the second conductive balls have a diameter equal to or greater than about 2.5 micrometers and less than or equal to about 3.5 micrometers.

6. The conductive adhesive film of claim 1, wherein each of the first and second insulating adhesive layers comprises an epoxy resin or an acrylic resin.

7. The conductive adhesive film of claim 1, wherein the first and second conductive balls comprise a metal material.

8. The conductive adhesive film of claim 7, wherein the metal material comprises at least one of nickel (Ni), cobalt (Co), chromium (Cr), and iron (Fe).

9. The conductive adhesive film of claim 1, wherein the second conductive balls are spaced from each other at regular intervals.

10. A conductive adhesive film comprising:
a first adhesive member comprising a first insulating adhesive layer having a first viscosity, a plurality of first conductive balls being in the first insulating adhesive layer; and
a second adhesive member comprising a second insulating adhesive layer having a second viscosity greater than the first viscosity, a plurality of second conductive balls being in the second insulating adhesive layer; and
a third adhesive member comprising a third insulating adhesive layer having a third viscosity less than the first viscosity.

11. The conductive adhesive film of claim 10, wherein the third insulating adhesive layer has a thickness equal to or greater than about 11.5 micrometers and less than or equal to about 12.5 micrometers.

12. The conductive adhesive film of claim 10, wherein the third viscosity is in a range equal to or greater than about 800 Pa·s and less than or equal to about 1,000 Pa·s.

* * * * *